United States Patent [19]
Berger et al.

[11] Patent Number: 6,020,750
[45] Date of Patent: Feb. 1, 2000

[54] WAFER TEST AND BURN-IN PLATFORM USING CERAMIC TILE SUPPORTS

[75] Inventors: Daniel George Berger, Wappingers Falls; James Noel Humenik, LaGrangeville, both of N.Y.; Mark Raymond LaForce, Essex Junction, Vt.; Charles Hampton Perry, Poughkeepsie, N.Y.

[73] Assignee: International Business Machines Corporation, Armonk, N.Y.

[21] Appl. No.: 08/882,989

[22] Filed: Jun. 26, 1997

[51] Int. Cl.⁷ .............................. G01R 1/073; G01R 31/02
[52] U.S. Cl. ........................ 324/755; 324/754; 324/760
[58] Field of Search ................................. 324/754, 755, 324/760, 765

[56] References Cited

U.S. PATENT DOCUMENTS

| | | | |
|---|---|---|---|
| 4,104,589 | 8/1978 | Baker et al. | 324/765 |
| 4,970,577 | 11/1990 | Ogihara et al. | 357/74 |
| 5,012,187 | 4/1991 | Littlebury | 324/754 |
| 5,055,780 | 10/1991 | Takagi et al. | 324/765 |
| 5,212,406 | 5/1993 | Reele et al. | 257/723 |
| 5,424,651 | 6/1995 | Green et al. | 324/754 |
| 5,461,328 | 10/1995 | Devereaux et al. | 324/765 |
| 5,477,160 | 12/1995 | Love | 324/755 |
| 5,497,079 | 3/1996 | Yamada et al. | 324/754 |
| 5,519,332 | 5/1996 | Wood et al. | 324/755 |
| 5,532,612 | 7/1996 | Liang | 324/760 |
| 5,534,786 | 7/1996 | Kaneko et al. | 324/760 |

FOREIGN PATENT DOCUMENTS 63-240056  10/1988  Japan .

OTHER PUBLICATIONS

"Multiple Substrate Package," *IBM Technical Disclosure Bulletin*, vol. 35, No. 4A, Sep. 1992, pp. 264–265.

"Postage Stamp Lamination of Reworkable Interposers for Direct Chip Attach," *IBM Technical Disclosure Bulletin*, vol. 36, No. 12, Dec. 1993, pp. 487–488.

*Primary Examiner*—Glenn W. Brown
*Attorney, Agent, or Firm*—James M. Leas; Jenkins and Gilcrest

[57] ABSTRACT

A plurality of multilayer glass-ceramic substrates are arranged in coplanar relationship in a tile pattern within a support platform. The glass-ceramic substrates and the support platform are both formed of materials having thermal expansion characteristics substantially equal to that of a wafer which is supported by the coplanarly aligned substrates during test and burn-in of the wafer. The present invention effectively solves the problem of providing a single large support member for wafer test and burn-in, which heretofore have been limited in mechanical properties and power capability.

18 Claims, 5 Drawing Sheets

WAFER TEST AND BURN-IN PLATFORM USING CERAMIC TILE SUPPORTS

BACKGROUND OF THE INVENTION

This invention relates generally to a test head structure for test and burn-in of a plurality of semiconductor chips on a wafer and a method for forming a test head structure, and more particularly to such a test head structure and method of forming in which the wafer support member comprises a plurality of ceramic tiles.

Semiconductor chips are typically formed as parts of a large wafer which, after formation, may contain several hundred, or even thousands, of individual semiconductor chips. Each of the individual chips must be tested to determine its operational characteristics and assure that it meets certain desired performance criteria. Heretofore it has been very difficult to test a full wafer due to the difficulty of contacting every test point on the entire wafer. The contacting system must be extremely flat, have perfect alignment with all of the wafer contacts, and have a thermal coefficient of expansion that is matched to the wafer. Furthermore, the contacting system must have wiring and input/output (I/O) capability for power and signals. Heretofore, a silicon wafer, such as the single-piece wafer described in commonly assigned U.S. Pat. No. 5,600,257, entitled *SEMI-CONDUCTOR WAFER TEST AND BURN-IN*, has been used as a platform for supporting a fabricated wafer. However, such wafers are limited in their mechanical properties and power transmission capability. Also, it is difficult and expensive to provide large area, single surface support platforms having the required electrical interconnect features capable of simultaneously testing all of the components on a large wafer.

An alternative solution to identifying and grading the various components of a wafer, typically referred to as identifying "known good die," includes processing the wafer through a dice-and-cut operation wherein the wafer is cut into its individual components, and the separated components mounted onto a test and/or burn-in board for subsequent performance testing. However, this operation is very time consuming, since each chip or die must be separately mounted, tested, identified, and sorted.

It is therefore desirable to have a suitable platform for test and burn-in in which a large wafer, for example a wafer having a diameter of up to 12 inches, can be fully supported. It is also desirable to have a suitable platform for wafer test and burn-in in which the support system for the wafer has a thermal coefficient of expansion substantially equal to that of the wafer, and is capable of simultaneously delivering test signals to the full wafer as well as provide power to each component of the wafer during burn-in. It is also desirable to have a method for forming such a test head structure that avoids the need to provide a large, single-member support surface for the full wafer.

BRIEF SUMMARY OF THE INVENTION

In accordance with one aspect of the present invention, a test head structure for testing a plurality of chips on a wafer includes a support platform having a thermal expansion characteristic that is substantially equal to the thermal expansion characteristic of the wafer. The test head structure further includes a plurality of multilayer substrates, each formed of a material having a thermal expansion characteristic that is substantially equal to the thermal expansion characteristic of the wafer. The multilayer substrates are coplanarly mounted on the support platform in a manner whereby they collectively provide a planar mounting surface for the wafer. Each of the multilayer glass-ceramic substrates has a wafer support surface on which a plurality of electrical contacts are disposed in a pattern.

Other features of the test head structure embodying the present invention include the support platform having a plurality of openings that are adapted to provide electrical communication through the support platform. Additional features include each of the substrates having a connector contact surface with a plurality of electrical contacts adapted for connection with a connector system, and a plurality of internally disposed electrically conductive circuits which provide electrical communication between the electrical contacts disposed on the wafer support surface and the electrical contacts on the connector contact surface of each substrate. Still other features include each of the multilayer substrates comprising four equally-sized rectangularly-shaped tiles that are arranged on the support platform in a rectangular pattern wherein at least two edges of each of the tiles are disposed in controlled space relationship with a respective edge of two other tiles. Yet another feature of the test head structure includes the support platform forming a framework providing support around the edges of each of the multilayer substrates, with the openings adapted for providing electrical communication through the platform being arranged to expose a plurality of electrical contacts disposed on the connector contact surface of each of the substrates when the substrates are mounted on the platform. Still other features of the test head structure embodying the present invention include the support platform being constructed of an iron-nickel alloy having a thermal coefficient of expansion of about $5.4 \times 10^{-6}$ m/m/C. ($3 \times 10^{-6}$ in./in./F.), and the multilayer substrates being formed of magnesium aluminosilicate.

In accordance with another aspect of the present invention, a method for forming a test head structure for testing and burn-in processing of a plurality of chips on a wafer includes constructing a support platform of a material having a thermal expansion characteristic substantially equal to the thermal expansion characteristic of the wafer, and forming a plurality of multilayer ceramic substrates having internally disposed electrical circuits. The substrates are also formed of a material having a thermal expansion characteristic substantially equal to the thermal expansion characteristic of the wafer and electrically conductive surface features are formed on a first surface of each of the substrates. The substrates are then arranged in a fixture with each of the substrates positioned in coplanar relationship with each other and the formed surface features are in controlled spaced relationship with the surface features of adjacently disposed substrates. The arranged substrates are then mounted in the support structure whereby the coplanar relationship of the substrates and the controlled spaced relationship of the respective defined features of the substrates are maintained in fixed relationship by the support platform during subsequent testing and burn-in processing of the wafer.

Other features of the method for forming a test head structure, in accordance with the present invention, include identifying at least two areas on each of the substrates for the formation of defined edges adapted for controlled spaced relationship positioning with a respective defined edge of another one of the substrates. A groove is machined in the first surface of each of the sintered substrates, with the groove being aligned with the area identified for formation of the defined edges. The machined grooves are filled with a composite ceramic-polymer material having a thermal expansion characteristic no greater than the thermal expansion characteristic of the substrate material. Each of the substrates is then cut along the filled grooves to form the defined edges.

Other features include each of the substrates being lapped and polished on the first surface of each of the substrates prior to forming the electrically conductive surface features, and depositing a passivation coating on each of the substrates subsequent to forming electrically conductive surface features on the first surface of the substrates and prior to arranging the substrates in coplanar relationship in a fixture. Still other features include forming electrically conductive surface features on a second surface of a substrate. Yet other features of the method for forming a test head structure, in accordance with the present invention, include the support platform being constructed of an iron-nickel alloy having a thermal coefficient of expansion of about $5.4 \times 10^{-6}$ m/m/C. ($3 \times 10^{-6}$ in./in./F.), the multilayer substrates being formed of magnesium aluminosilicate, and the ceramic-polymer material comprising the material for filling the machined grooves in the substrates being beta eucryptite in a thermally stable polymer matrix.

BRIEF DESCRIPTION OF THE SEVERAL VIEWS OF THE DRAWING

A more complete understanding of the structure, operation, and method of forming the test head structure embodying the present invention may be had by reference to the following detailed description, when taken in conjunction with the accompanying drawings, wherein.

DETAILED DESCRIPTION OF THE INVENTION

Figure 1:
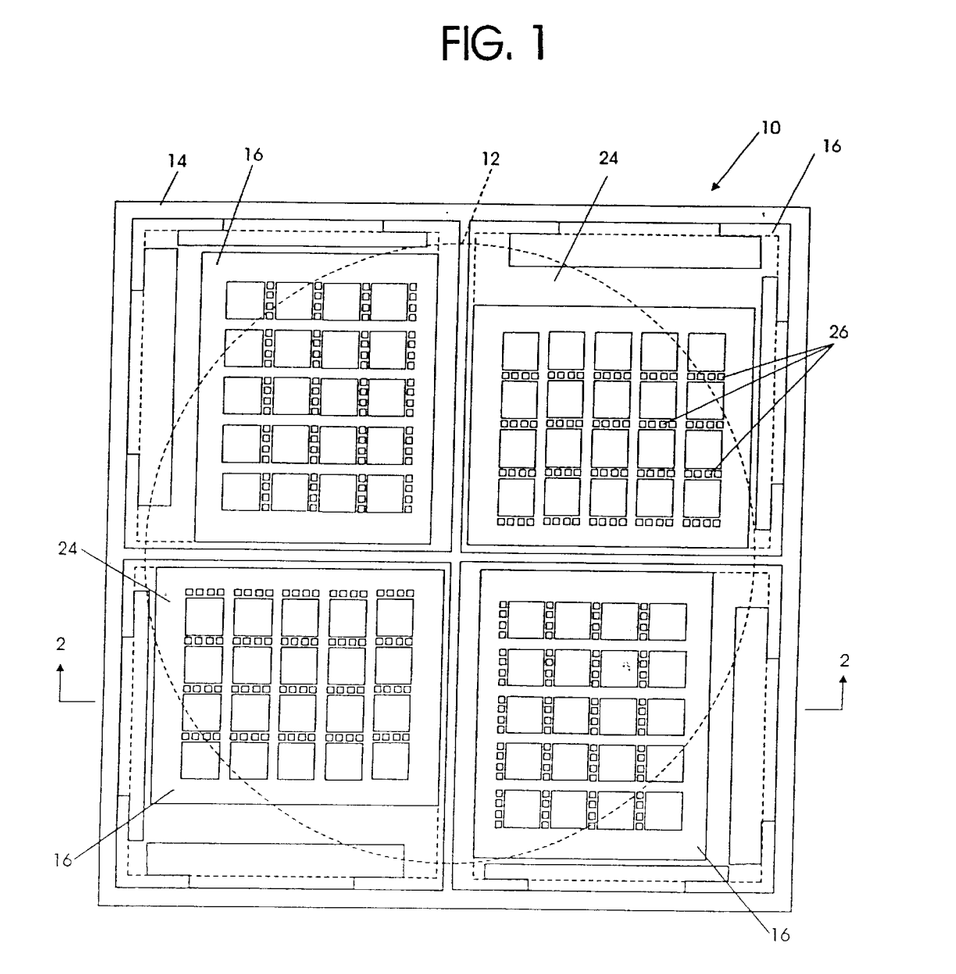
FIG. 1 is a plan view of the test head structure embodying the present invention.
Figure 2:
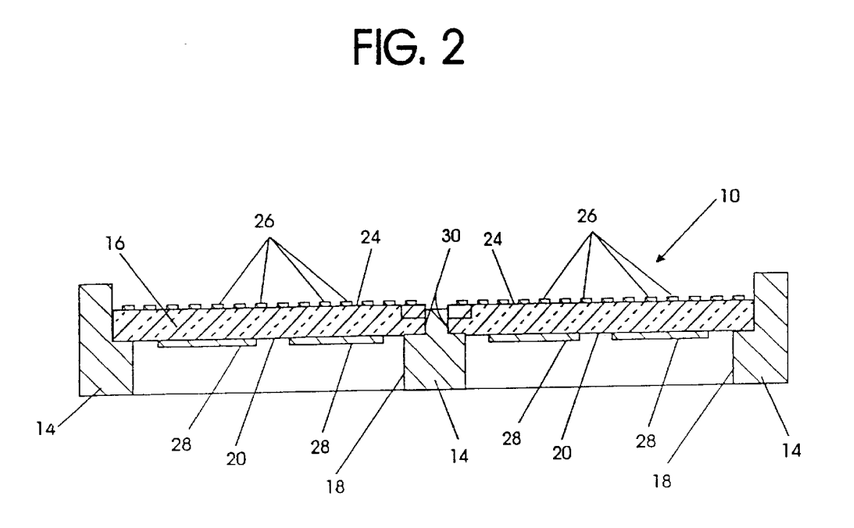
FIG. 2 is a cross-sectional view of the test head structure embodying the present invention, taken along the line 2—2 of FIG. 1.

A test head structure, or assembly, 10 shown in plan view in FIG. 1 and in cross section in FIG. 2, includes a support platform 14 and a plurality of multilayer substrates, or tiles 16. The test head is for testing a plurality of chips on wafer 12, as shown in phantom in FIG. 1. The support platform 14 and the multilayer substrates 16 are formed of a material, or materials, having a thermal expansion characteristic that is substantially equal to the thermal expansion characteristic of the wafer 12. The term "thermal expansion characteristics" as used herein and in the claims, means the amount of expansion or contraction of the designated material in a defined orientation or direction, at a defined temperature, as a function of change in temperature. More specifically, as used herein the term "thermal expansion characteristic" is the coefficient of thermal expansion (TCE) of the referenced material within the thermal operating range of the test head structure. Typically, wafers containing a plurality of semiconductor devices are primarily formed of silicon dioxide ($SiO_2$) which has a thermal coefficient of expansion (TCE) of about $4.9 \times 10^{-6}$ m/m/C. ($2.7 \times 10^{-6}$ in./in./F.). Therefore, in the preferred embodiment of the present invention, the support platform 14 and the multilayer substrates 16 are formed of materials having a thermal coefficient of expansion from about $4.5 \times 10^{-6}$ m/m/C. ($2.5 \times 10^{-6}$ in./in./F.) to about $5.4 \times 10^{-6}$ m/m/C. ($3 \times 10^{-6}$ in./in./F.).

Figure 7:
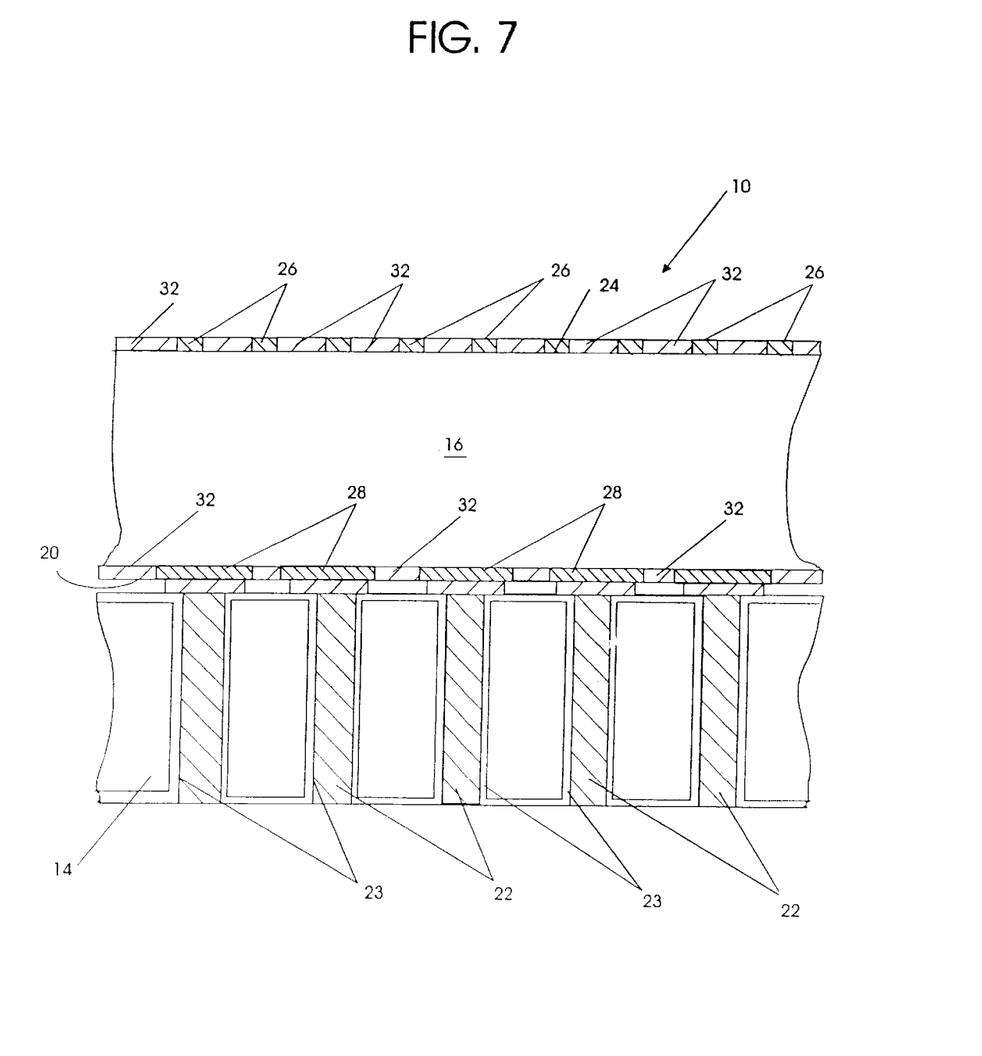
FIG. 7 is an enlarged sectional view of an alternate embodiment of the test head structure embodying the present invention.

Preferably, the support platform 14 is formed of an iron-nickel alloy, such as INVAR, which contains about 36% nickel with the balance iron, and a TCE of about $5.4 \times 10^{-6}$ m/m/C. ($3 \times 10^{-6}$ in./in./F.). In the preferred embodiment, the support platform 14 forms a framework that separately supports each of the multilayer substrates 16 around the edge of each of the substrates 16. The framework defines a plurality of openings 18 (FIG. 2) that extend through the support platform 14 and provide access to a connector contact surface 20 on each of the multilayer substrate 16 and clearance for capacitors or other components mounted on the connector contact surface 20 when the substrates 16 are mounted in the support platform 14. In an alternative embodiment of the support platform 14, shown in FIG. 7, the support platform 14 is essentially a planar structure extending across the full lower surfaces of the substrates 16. In the alternate embodiment, electrical communication between test and burn-in drive components, not shown, and the connector contact surface 20 of the substrates 16, is provided by a plurality of insulated conductive passageways 22 extending through the platform 14. In either arrangement, the support platform 14 typically has a thickness of from about 6.0 cm (0.25 in.) to about 1.3 cm (0.50 in.).

In the preferred embodiment of the present invention, the multilayer substrates 16 are formed of a glass-ceramic material such as magnesium aluminosilicate $Mg_2(Al_4Si_5O_{18})$ having a cordierite crystal structure and a TCE of about $5.4 \times 10^{-6}$ m/m/C. ($3 \times 10^{-6}$ in./in./F.). In the preferred embodiment, four of the multilayer glass-ceramic substrates 16, each having a rectangular shape, are mounted in a tile pattern, in coplanar relationship with each other on the support platform 14. The four multilayer glass-ceramic substrates 16 collectively provide a flat mounting surface for the wafer 12. For that purpose, each of the multilayer glass-ceramic substrates 16 have an electrical contact surface 24 on which are formed a large number of electrical contacts, or surface features, 26, each adapted to provide connection with a predetermined contact point on the wafer 12. In an exemplary embodiment, the surface features 26 are small electrically conductive pads having a diameter of about 75 μm and a feature-to-feature pitch of about 250 μm. Thus, to provide adequate margins between the outermost conductive pads 26 and the edge of the substrate 16, the edges of the substrates in the exemplary embodiment are very closely spaced apart by a distance of only about 75 μm and within a tolerance of about ±12 μm. The conductive pads 26 are preferably formed by conventional thin film techniques and have a metallurgical hierarchy of Cr/Cu/Ni/Au. To assure good electrical contact during testing and burn-in, it is desirable that the planarity of the surface of each of the substrates 16, within itself and with respect to the adjacent substrates, be within about 10 μm. A plurality of surface features 28, comprising input/output pads and other electrical contacts as may be required, are also provided on the connector contact surface 20 of each of the multilayer glass-ceramic substrates 16.

If desired, the multilayer glass-ceramic substrates 16 may have other than a rectangular shape. However, for ease of manufacture as described below in greater detail, it is desirable that each of the substrates 16 have the same shape and construction. In the preferred embodiment, the glass-ceramic substrates comprise four equally-sized rectangularly-shaped tiles each of which have four defined straight edges 30. The tiles 16 are arranged on the support platform 14 in a rectangular pattern such that two of the edges 30 of each of the tiles 16 are disposed in controlled space relationship with a respective edge 30 of other, adjacently positioned, tiles 16. By way of example, in the exemplary embodiment described herein, four approximate 108 mm by 108 mm (4¼ in. by 4¼ in.) multilayer glass-ceramic substrates 16 are be arranged in a tile pattern as shown in FIG. 1 to provide support for a 20.3 cm (8 in.) diameter wafer 12.

Figure 8:
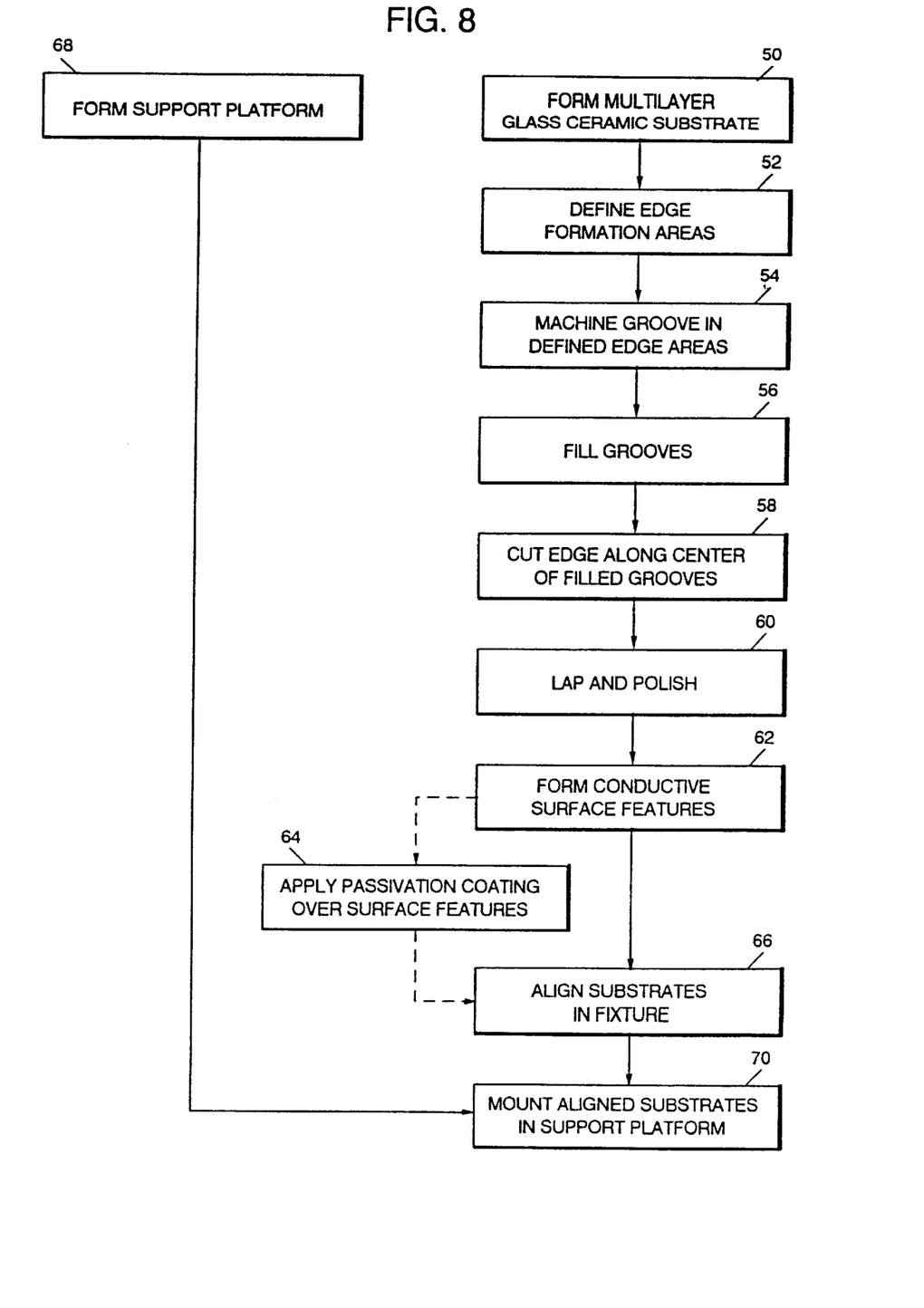
FIG. 8 is a flow chart showing the primary steps carried out in accordance with the method for forming a test head structure in accordance with the present invention.

In the method for forming a test head structure 10 in accordance with the present invention, and shown in diagram form in FIG. 8, the multilayer glass-ceramic substrates 16 are formed as indicated at block 50 and described in commonly assigned U.S. Pat. Nos. 5,130,067 and 4,234,367 respectively entitled *METHOD AND MEANS FOR CO-SINTERING CERAMIC/METAL MLC SUBSTRATES* and *METHOD OF MAKING MULTILAYER GLASS-CERAMIC STRUCTURES HAVING AN INTERNAL DISTRIBUTION OF COPPER CONDUCTORS*. Preferably, multilayer glass-ceramic substrates 16 are formed by conventional green sheet processing. Green sheet processing includes mixing powdered glass-ceramic with an organic, i.e., polymer, carrier thereby forming a flowable mixture of glass-ceramic particles suspended in a polymer matrix. The mixture is cast as sheets and then heated to drive off solvents. The somewhat solidified green sheet is then punched to form holes, for example about 100 μm in diameter, which are subsequently filled with a conductive paste formed of metal particles, for example copper in a flowable polymer forming an ink, which is screened onto the green sheets to form conductive patterns on the sheets. The green sheets with conductive patterns and filled vias, are then carefully aligned and stacked in their aligned relationship. The aligned stack of sheets is then compressed, or laminated together, to form a three-dimensional unfired composite network comprising multilayers of the glass-ceramic sheets having conductive circuits and vias.

The compressed structure is then placed in a furnace and heated to drive off all organic materials, sinter the ceramic body, and densify the metal structures, to produce a dense, hard, glass-ceramic structure with internally disposed conductive networks. Preferably, the internal conductive circuitry in the substrates 16 is formed of copper having a thickness sufficient for carrying a high amperage flow of electrical power during high speed burn-in exercising of the wafer 12. In the exemplary embodiment, the internally disposed copper conductors have a thickness of about 25 μm and a width of about 75 μm. Typically, the multilayer glass-ceramic substrates 16 have a thickness of from about 1.5 mm (0.06 in.) to about 8 mm (0.3 in.).

Figure 4:
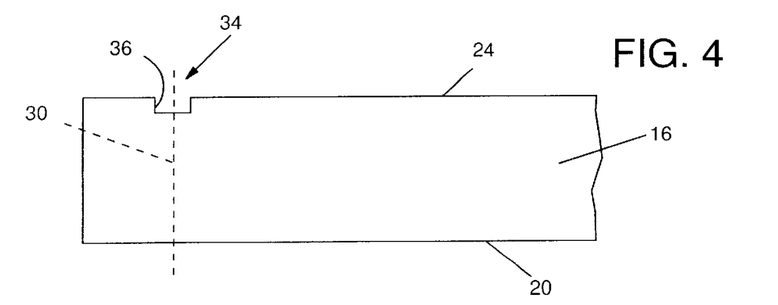
FIG. 4 is an enlarged sectional view of a portion of a substrate quadrant of the test head structure embodying the present invention, showing a groove machined in a first surface of the substrate in an area defined for subsequent cutting to form a defined edge.
Figure 5:
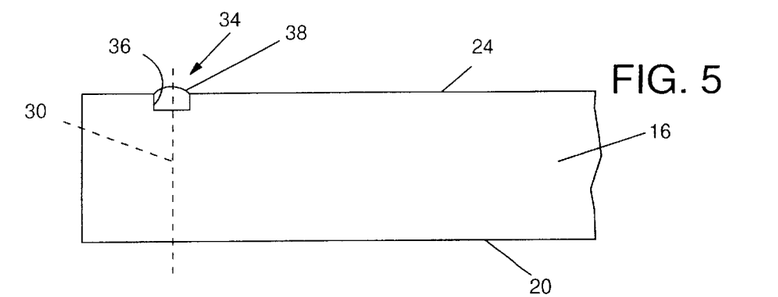
FIG. 5 is an enlarged sectional view of a portion of a substrate quadrant of the test head structure embodying the present invention, showing the machined groove filled with a fine-grained material prior to sawing the substrate to form the defined edge.

In order to properly align adjacently disposed multilayer glass-ceramic substrates 16, and provide the critical, above-described, feature-to-feature spacing between substrates, it is necessary that adjacently disposed edges 30 of the substrate 16 be precisely and sharply defined. Glass-ceramic materials can be easily cut along a desired line. However, the severed edge may not be as smooth and even as desired. For example, in the above described exemplary embodiment, it is necessary to maintain surface features(conductive pads 26) of one substrate 16 within a tolerance of about ±12 μm with respect to the surface features on an adjoining substrate 16. In other embodiments, it may be necessary to maintain the respective surface features within a tolerance of about ±5 μm. It is difficult to provide a sawed edge surface with a finish sufficient for use as a reference plane for such precise relative positioning of subsequently formed surface features. For that purpose, the desired edge lines 30, shown in dotted lines in FIGS. 4 and 5, are defined in a selected edge area 34 as indicated at block 52. A shallow groove 36 is machined in the wafer contact surface 24, preferably in central alignment with the desired edge line area 34. The groove 36 may be formed by laser ablation, grinding, or other conventional machining method. In this step, as indicated at block 54, it is only necessary that the groove area not extend into any of the previously formed internal circuitry of the substrate 16. For example, the groove 36 may typically have a width of about 200 μm and a depth of about 100 μm.

After machining, the grooves 36 are filled with a filler, preferably a composite-ceramic material having a thermal coefficient of expansion that is no greater than the coefficient of expansion of the substrate material. A suitable material for the filler 38 is very fine grained beta eucryptite (lithium aluminum silicate) which advantageously has a negative thermal coefficient of expansion in the test and burn-in temperature range of the wafer 10. A thermally stable polymer having a TCE within about $3.6 \times 10^{-6}$ m/m/C. ($2 \times 10^{-6}$ in./in./F.) of the wafer 12, for example polyimide, provides a suitable matrix for the powder. This step in the process, represented at block 56, may require multiple filling and heating to solidify the fill material 38 due to shrinkage of the material 38 during solidification. The final fill may extend slightly above the wafer contact surface 24 of the substrate 16 as shown in FIG. 5. The overfill can be readily removed during lapping and polishing of the wafer contact surface 24, as described below.

After filling the groove 36 with the fine grained ceramic-polymer material 38, a cut is made through the groove fill material 38, as indicated at block 58, to form the actual defined edges 30 of the substrate 16. The surface finish of the edges 30, in the filled areas adjacent the wafer contact surface 24, will have a smooth finish as a result of the fine-grained ceramic in the fill, thereby enabling precise positioning of subsequently formed surface features 26 on the wafer contact surface 24 of the substrate 16, as described below.

The wafer contact surface 24 of each of the multilayer glass-ceramic substrates 16 is then lapped and polished to provide a mirror smooth finish and planarity within 10 μm, as represented by block 60. A smooth surface finish is necessary to assure subsequent contact with the myriad connection points of the wafer 12. The connector contact surface 20 of each of the multilayer glass-ceramic substrates 16 will be connected to a contactor system provided by drive boards having Pogo probes or other temporary contact attachment arrangements. Typically, the minimum connector contact pitch, or spacing, on the connector contact surface 20 of the multilayer glass-ceramic substrates will be on the order of about 1 mm (0.04 in.) whereas the feature-to-feature spacing on the wafer contact surface 24 of the substrate 16 may have a pitch as low as 0.2 mm (0.008 in.).

After lapping and polishing, the conductive surface features 26, 28 are formed on the wafer contact and connector contact surfaces 24, 20, as represented at block 62. The electrically conductive surface features 26, 28 in the above-described exemplary embodiment are 75 μm dia. pad formed of gold over a nickel base which, in turn, may overly previously applied layers of chromium and copper. The electrically conductive surface features 26, 28 are in electrical communication with predetermined internal circuits, not shown, of the substrate 16. The gold, nickel, copper and chromium coatings may be conveniently formed by conventional evaporation or plating processes commonly used to form conductive surface features on printed circuit boards and thin film structures.

Figure 3:
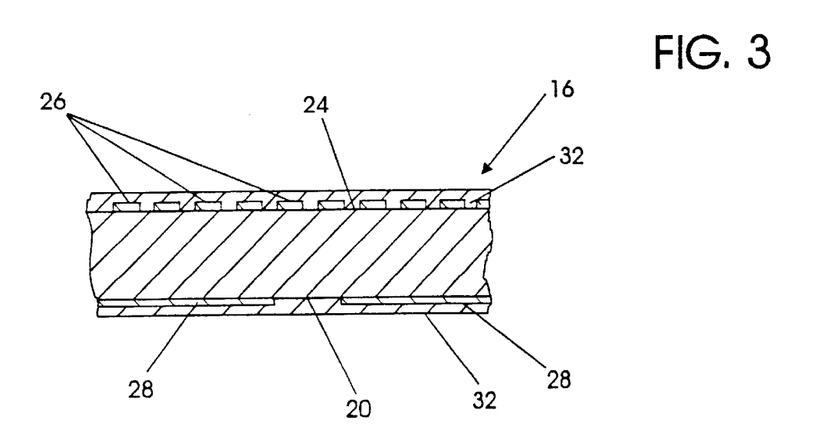
FIG. 3 is an enlarged sectional view of the one of the substrate quadrants of the test head structure embodying the present invention, showing the substrate quadrant at an intermediate stage of formation.

After formation of the conductive surface features 26, 28, a passivation coating 32 is desirably applied over the external planar surfaces 20, 24 of each of the substrates 16. This optional step is represented by block 64. The passivation coating 32 advantageously covers the previously formed surface features 26, 28 and protects those features during subsequent handling during alignment of the substrate 16 in a fixture, described below in greater detail. The passivation coating 32 may be provided by a conventional photoresist material normally used as a precursor to light exposure and etching. A cross-section of the multilayer glass-ceramic substrate 16, after formation of the conductive surface features 26, 28 and deposition of the passivation coating 32, is shown in FIG. 3.

Figure 6:
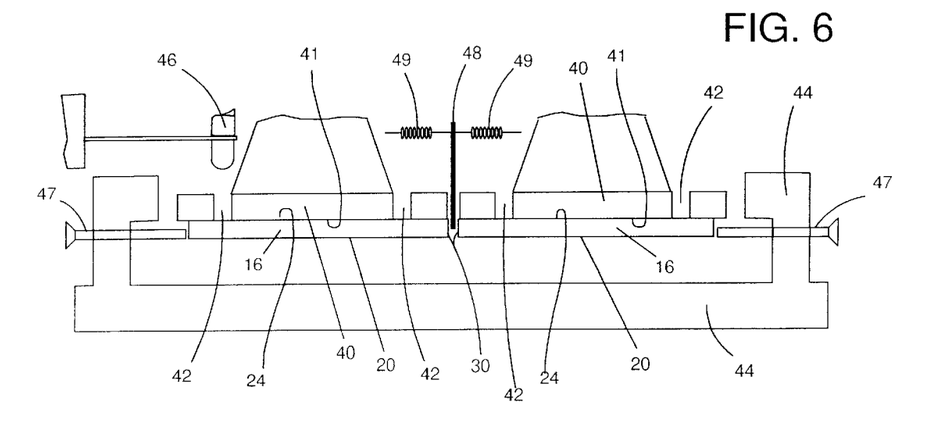
FIG. 6 is a schematic sectional view of an assembly fixture adapted for precision positioning of the substrate quadrant components of the test head structure embodying the present invention.

After formation of the multilayer glass-ceramic substrates 16, they are arranged in their respective approximate relative positions on a vacuum chuck 40 (shown inverted in FIG. 6). The wafer contact surface 24 of each of the substrates 16 contacts a prepared flat face of a platen 41 of the chuck 40 that is planar to within, or at the most, about ±5 μm. A continuous vacuum, or suction force, is maintained by the vacuum chuck 40 to hold the substrates 16 in their respective approximate positions. The vacuum chuck 40 is then inverted and placed on a controllably positionable platform or table 44, as illustrated in FIG. 6, that is incrementally movable in both an X and a Y axis. The platen 41 of the vacuum chuck 40 has a plurality of openings 42 extending through the platen 41 which permit observation of preapplied positioning indicia, or targets, on the wafer contact surface 24 of the substrates 16, after the substrates 16 are mounted on the vacuum chuck 40.

After placement on the movable table 44, the vacuum chuck 40 is moved along the X and Y axes to a predefined coordinate position at which one of the openings 42 is aligned with a fixed position microscope 46. The substrate 16 underlying the selected opening 42 is vertically lightly held against the face of the platen 41, in co-planar relationship with the other substrates 16, by a negative pressure of about 0.07–0.14 kg/cm² (1 or 2 psi) provided by the vacuum chuck 40. The substrate to be first aligned is positioned under a selected one the openings 42, in general alignment with the microscope 46. As shown in FIG. 6, the movable table 44 has a plurality of fine-pitched screws 47 mounted in the side walls of the table 44 and are arranged so that the distal ends of the screws 47 abut both of the outer peripheral side walls of each of the substrates 16. Desirably, two spaced apart screws 47 are provided along each of the two outer edges of each substrate 16. Thus, one or more members of the two pairs of screws 47 can be slowly turned to incrementally move the substrate 16 in both the X and Y horizontal directions. A bias force to urge the substrates 16 against the ends of the adjusting screws 47, and provide a force to move the substrates 16 outwardly when the screws 47 are loosened, is provided by a thin blade 48, having a first portion, or end, that is inserted between the inwardly positioned edges of two of the substrates 16. The other end of the blade 48 is attached to a tension spring 49 that, in turn, is attached to the table 44 (not shown). Preferably, two blades 48 are disposed along each of the two inwardly disposed edges 30 of each of the substrates 16, in respective opposed alignment with one of the pair of screws 47 contacting a respective outer edge of the substrate 16.

The substrate 16 is moved horizontally by incremental adjustment, in either a clockwise or counter-clockwise direction, by turning the corresponding screws 47 in contact with the two outer edges of the substrate 16, until a desired first one of the predefined targets on the substrate 16 is brought into alignment with the cross-hairs of the microscope 46. After aligning the substrate 16 wherein a first target on the substrate 16 is correctly positioned with respect to the fixed microscope, the table 44 is then moved a predetermined distance in the horizontal X and Y directions whereat another opening 42 in the chuck 40 is aligned with the microscope 46 and generally positioned over a second target indicia provided on the same substrate 16. The substrate 16 is then incrementally moved by the adjusting screws 47 to align the second target with the cross-hairs of the microscope 46. This process is repeated until both target areas on a first substrate 16 are precisely aligned with respect to a predetermined position represented by the intersection of the cross-hairs on the fixed microscope when the x-y table 44 is at predetermined coordinates. As represented at block 66, the above alignment process for the first substrate 16 is repeated for the remaining substrates 16 until all four substrates 16 are precisely aligned with their respective adjacently disposed edge surfaces 30 in controlled spaced relationship with respect to each other.

The preformed support platform 14 is then positioned under the aligned substrates 16, and the vacuum pressure increased to about 1 kg/cm² to securely maintain the substrates 16 in their respective aligned positions during installation of the substrates 16 in the support platform 14. As described above with respect to the preferred embodiment illustrated in FIG. 2, the support platform 14 is arranged to form a framework adapted to support the multilayer glass-ceramic substrates 16 along all four edges of each substrate. In the preferred embodiment, the support platform 14 has orthogonal vertical and horizontal surfaces formed in the framework to separately receive each of the substrates 16, as shown in FIG. 2. Alternatively, the edge surfaces 30 of the substrates 16 may be beveled and the framework of the support platform 14 tapered to receive the beveled edges of the substrates 16.

In yet another alternative arrangement, as described above and shown in assembled relationship in FIG. 7, the support platform 14 has a substantially planar construction with conductive passageways, or vias, 22 extending through the platform 14. In this later arrangement, if the support platform 14 is formed of an electrically conductive material, a nonconductive coating 23, such as parylene, is deposited on the support platform 14 prior to filling the passageways 22 with an electrically conductive material 25 such as a conductive epoxy. In this manner, electrical contact with the contacts 28 disposed on the bottom surface 20 the substrates 16, is achieved through the support platform 14. Parylene has excellent dielectric properties and is a particularly suitable material for insulating the electrically conductive material 25 from the electrically conductive support platform 14 due to its ability to conformally deposited, to a nominal thickness of about 50 μm, on the internal surfaces of the passageways 22 by vapor deposition.

After formation of the support platform 14, as indicated by block 68, the platform 14 is placed in an aligned position below the substrates 16 which are maintained in their respectively aligned positions by the vacuum chuck 40. An adhesive, such as an epoxy preferably having a coefficient of expansion approximately equal to that of the substrates 16 and the support platform 14, is then deposited, by conventional brush application to a depth of from about 15 μm to about 25 μm, on surfaces of the support platform 14 that will come in contact with the substrates 16 when the two members are brought together. The support platform 14 and multilayer glass-ceramic substrates 16 are then brought into mutual contact by either raising the support platform 14 or lowering the chuck 40, while the critical coplanar alignment and feature spacing of the substrates 16 is maintained by the vacuum chuck 40. Small gap tolerances along the edges 30 and variations in the planarity of the connector contact surface 20 of the multilayer glass-ceramic substrate 16 are readily filled by the adhesive joining material. It is important that the mounted substrates 16 be in coplanar relationship with each other and that the spaced relationship of the respective defined edges 30 of the substrates be maintained in fixed relationship by the support platform 14 during subsequent testing and burn-in processing of the wafer 10. Mounting of the aligned substrates 16 in the support platform 14 is indicated by block 70. After curing of the adhesive material joining the substrates 16, in their respectively coplanarly aligned positions, to the support platform 14, the assembled test head structure 10 is then removed from the vacuum chuck 40 and, after removal of the passivation coating 32 from the surface contacts 26,28, is ready for use.

Thus it can be seen that the present invention provides a platform for test and burn-in of an entire wafer without requiring the formation of a large single component support surface. The present invention uses four glass-ceramic substrates or tiles, 16 to form the functional equivalent of a single large substrate as the support surface for wafer test and burn-in. Furthermore, the four glass-ceramic substrates 16 and the support platform 14 in which the substrates are mounted have a thermal coefficient of expansion that is matched to the test wafer.

Although the present invention is described in terms of a preferred exemplary embodiment, with specific illustrative key constructions, arrangements an order of the manufacturing, those skilled in the art will recognize that changes in those constructions, arrangements, manufacture, and in the specifically identified materials, may be made without departing from the spirit of the invention. For example, with reference to the manufacturing sequence, cutting the edges of the tiles may be carried out after the formation of conductive surface features. Alternatively, edge cutting of the tiles may be carried out after lapping and polishing, rather than as an earlier step as described in the illustrative embodiment. Such changes are intended to fall within the scope of the following claims. Other aspects, features and advantages of the present invention may be obtained from a study of this disclosure and the drawings along with the appended claims.

What is claimed is:

1. A test head structure for testing a plurality of chips on a wafer having a wafer thermal expansion characteristic, said test head structure comprising:

a support platform formed of a material having a thermal expansion characteristic substantially equal to the wafer thermal expansion characteristic, wherein said support platform has a plurality of openings; and a plurality of multilayer substrates each formed of a material having a thermal expansion characteristic substantially equal to the wafer thermal expansion characteristic and having a wafer support surface and a back surface, said wafer support surface comprising a plurality of electrical contacts disposed in a pattern, said substrates being mounted on said support platform wherein said back surface of said plurality of multilayer substrates is accessible through said openings.

2. A test head structure, as set forth in claim 1, wherein each of said substrates include a connector contact surface having a plurality of electrical contacts with a connector system, and a plurality of internally disposed electrically conductive circuits providing electrical communication between preselected electrical contacts disposed on the wafer support surface and the connector contact surface of said substrate.

3. A test head structure, as set forth in claim 2, wherein said plurality of openings is for providing electrical contact with the connector contact surface of each of said substrates.

4. A test head structure, as set forth in claim 1, wherein said plurality of multilayer substrates are constructed to apply power and test signals to a plurality of chips on the wafer during a defined test sequence.

5. A test head structure, as set forth in claim 1, wherein said support platform is constructed of an iron-nickel alloy having a thermal coefficient of expansion of about $5.4 \times 10^{-6}$ m/m/C. ($3 \times 10^{-6}$ in./in./F.).

6. A test head structure, as set forth in claim 1, wherein said multilayer substrates are formed of magnesium aluminosilicate.

7. A test head structure, as set forth in claim 1, wherein said plurality of substrates comprise four equally-sized rectangularly-shaped tiles each having four defined edges, said tiles being arranged on said support platform in a rectangular pattern wherein two edges of each of said tiles are respectively disposed in controlled spaced relationship with a respective edge of two other of said tiles.

8. A test head structure, as set forth in claim 7, wherein each of said substrates includes a connector contact surface having a plurality of electrical contacts with a connector system and said support platform comprises a framework providing support around the edges of each of said multilayer substrates and defines a plurality of openings arranged to expose the plurality of electrical contacts disposed on the connector contact surface of each of the substrates when said substrates are mounted on said support platform.

9. A test head structure, as set forth in claim 1, wherein each of said glass-ceramic substrates has a thickness of from about 1.5 mm (0.06 in.) to about 8 mm (0.3 in.).

10. A test head structure, as set forth in claim 1, wherein:

each of said substrates includes a connector contact surface having a plurality of electrical contacts disposed thereon; and said support platform includes a first surface having a plurality of electrical contacts arranged for connection with contacts disposed on the connector contact surface of the substrates, a second surface spaced from said first surface and having a plurality of electrical contacts arranged thereon, and a plurality of insulated conductive passageways extending between the electrical contacts disposed on said first surface and the electrical contacts disposed on said second surface of the support platform.

11. A method for forming a test head structure for testing a plurality of chips on a wafer having a predefined thermal expansion characteristic, comprising:

providing a support platform of a material having a thermal expansion characteristic substantially equal to the thermal expansion characteristic of said wafer;

providing a plurality of multilayer substrates, said substrates each having a first planar surface and a second planar surface, said second surface opposite said first surface, said substrates having internally disposed electrical circuits for connecting electrically conductive surface features on said first surface with electrically conductive surface features on said second surface, said substrates being formed of a material having a thermal expansion characteristic substantially equal to the thermal expansion characteristic of said wafer;

forming said electrically conductive surface features on said first surface and on said second surface of each of said substrates;

arranging said substrates in a fixture whereby each of said substrates is arranged in coplanar relationship with other ones of said substrates and at least one defined edge of each of said substrates is disposed in controlled spaced relationship with a respective defined edge of at least one other of said substrates; and mounting said arranged substrates in said support platform whereby the coplanar relationship of the substrates and the controlled spaced relationship of the respective defined edges of the substrates are maintained in fixed relationship by said support platform during subsequent testing and burn-in processing of the wafer.

12. A method for forming a test head structure, as set forth in claim 11, wherein said method include:

identifying at least two areas on each said substrates for the formation of the defined edges subsequently positioned in controlled spaced relationship with a respective defined edge of another one of said substrates;

machinig a groove in said first surface of each of said substrates, said grooves being respectively aligned with said areas identified for formation of the defined edges;

filling said groove with a composite ceramic-polymer material having a thermal coefficient of expansion no greater than the coefficient of expansion of said substrate material; and sawing each of said substrates along said filled grooves.

13. A method for forming a test head structure, as set forth in claim 12, wherein said composite ceramic-polymer material comprising the material for filling the machined grooves in the substrates is beta eucryptite in a thermally stable polymer matrix having a thermal coefficient of expansion within at least $3.6 \times 10^{-6}$ m/m/C($2 \times 10^{-6}$ in./in./F) of the thermal coefficient of expansion of said wafer.

14. A method for forming a test head structure, as set forth in claim 11, wherein prior to forming electrically conductive surface features on a first surface of each of the substrates, said method includes:

lapping said first surface of each of the substrates; and polishing said first surface of each of the substrates.

15. A method for forming a test head structure, as set forth in claim 11, wherein said method includes forming electrically conuctive surface features on a second surface of each of the substrates.

16. A method for forming a test head structure, as set forth in claim 11, wherein said method includes depositing a passivation coating on each of said substrates subsequent to forming electrically conductive surface features and prior to arranging the substrates in said fixture.

17. A method for forming a test head structure, as set forth in claim 11, wherein said support platform is constructed of a iron-nickel alloy having a thermal coefficient of expansion of about $5.4 \times 10^{-6}$ m/m/C($3 \times 10^{-6}$ in./in./F).

18. A method for forming a test head structure, as set forth in claim 11, wherein said multilayer substrates are formed of magnesium aluminosilicate.

\* \* \* \* \*